(12) United States Patent
Sung

(10) Patent No.: US 8,563,852 B2
(45) Date of Patent: Oct. 22, 2013

(54) SOLAR CELL HAVING IMPROVED ELECTRON EMISSION USING AMORPHOUS DIAMOND MATERIALS

(76) Inventor: Chien-Min Sung, Tansui (TW)

(*) Notice: Subject to any disclaimer, the term of this patent is extended or adjusted under 35 U.S.C. 154(b) by 251 days.

(21) Appl. No.: 12/207,351

(22) Filed: Sep. 9, 2008

(65) Prior Publication Data

US 2009/0065052 A1    Mar. 12, 2009

Related U.S. Application Data

(60) Provisional application No. 60/993,219, filed on Sep. 10, 2007.

(51) Int. Cl.
*H01L 31/00* (2006.01)

(52) U.S. Cl.
USPC ........................................................ 136/256

(58) Field of Classification Search
USPC ........................................................ 136/256
See application file for complete search history.

(56) References Cited

U.S. PATENT DOCUMENTS

| | | | |
|---|---|---|---|
| 4,633,030 A * | 12/1986 | Cook ............................ | 136/246 |
| 5,562,781 A | 10/1996 | Ingram et al. | |
| 5,981,071 A | 11/1999 | Cox | |
| 6,064,137 A | 5/2000 | Cox | |
| 6,993,513 B2 | 1/2006 | Beams et al. | |
| 2006/0185714 A1* | 8/2006 | Nam et al. ..................... | 136/244 |
| 2006/0283498 A1* | 12/2006 | Gronet .......................... | 136/256 |
| 2008/0314447 A1* | 12/2008 | Walukiewicz et al. ........ | 136/261 |

FOREIGN PATENT DOCUMENTS

WO    WO 2006/060476    6/2006

OTHER PUBLICATIONS

Abroug et al., Determination of doping effects on Si and GaAs bulk samples properties by photothermal investigations, Jul. 2007, Physica B 400, 163-167.*
Veerasamy et al., Photoresponse characteristics of n-type tetrahedral amorphous carbon/p-type Si heterojunciton diodes, Appl. Phys. Lett. 64 (17), 1994, 2297-2299.*
Han, PV characteristics of a-Si solar cells using B-doped tetrahedral a-carbon films as p-type window materials, Appl Physics Lett, 90, 083508 (2007).*
W I Milne, Electronic devices from diamond-like carbon, IOP electronic journals, Semiconductor Science and Technology. http://www.iop.org/EJ/abstract/0268-1242/18/3/312. As accessed on Apr. 12, 2007. 1 page.
James Chien-Min Sung et al., Amorphous Diamond Electron Emission for Thermal Generation of Electricity. NSTI-Nanotech 2005, www.nsti.org, ISBN0-9767985-1-4 vol. 2, 2005. pp. 193-196.
Dye-sensitized solar cells, From Wikipedia, the free encyclopedia. http://www.en.wikepedia.org/wiki/Dye-sensitized_solar_cells. As accessed on Aug. 14, 2007. pp. 1-6.

(Continued)

*Primary Examiner* — Jennifer Michener
*Assistant Examiner* — Shannon Gardner
(74) *Attorney, Agent, or Firm* — Thorpe North & Western LLP

(57) ABSTRACT

Solar cells and related methods using thin layers of amorphous diamond. A thin layer of amorphous diamond is in electrical communication with a conductor. The use of a thin layer of amorphous diamond helps to reduce back conversion of excited electrons to heat. Reduced back conversion in turn can provide an increase in the efficiency of solar cells using the presently disclosed techniques.

17 Claims, 4 Drawing Sheets

(56) References Cited

OTHER PUBLICATIONS

Solar Cell, From Wikipedia, the free encyclopedia. http://en.wikipedia.org/wiki/Solar_cell. As accessed on Apr. 12, 2007. pp. 1-17.

Wilson, Solar Cells. Connexions. http://cnx.org/countent/m11343/latest/. As accessed on May 23, 2007. pp. 1-4.

James Chien-Min Sung et al., Amorphous Diamond Electron Emitter. Advanced Diamond Energy; An Advanced Diamond Solutions, Inc. Initiative. Introductory Technology Overview. 2005. bmonteith@advanceddiamond.com. 17 pages.

* cited by examiner

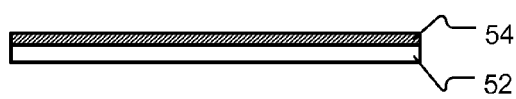
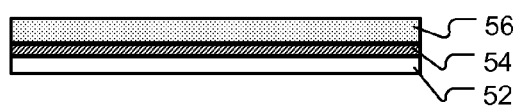
FIG. 5(a)  FIG. 5(b)
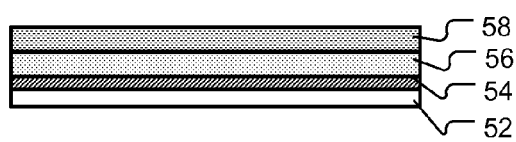
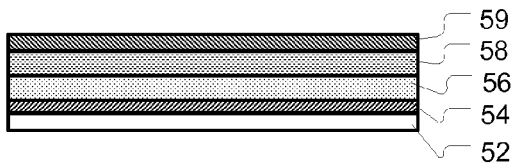
FIG. 5(c)  FIG. 5(d)

SOLAR CELL HAVING IMPROVED ELECTRON EMISSION USING AMORPHOUS DIAMOND MATERIALS

PRIORITY DATA

This application claims the benefit of U.S. Provisional Patent Application Ser. No. 60/993,219, filed on Sep. 10, 2007, which is incorporated herein by reference.

FIELD OF THE INVENTION

The present invention relates generally to devices and methods for generating electrical power, including in particular the use of amorphous diamond materials. Accordingly, the present application involves the fields of physics, chemistry, electricity, and material science.

BACKGROUND OF THE INVENTION

Solar cell technology has progressed over the past several decades resulting in a significant contribution to potential power sources in many different applications. Despite dramatic improvements in materials and manufacturing methods, solar cells still have conversion efficiency limits well below theoretical efficiencies, with current conventional solar cells having maximum efficiency of about 26%. Various approaches have attempted to increase efficiencies with some success. Some previous approaches include light trapping structures and buried electrodes in order to minimize surface area shaded by the conductive metal grid. Other methods have included rear contact configurations where recombination of hole-electron pairs occurs along the rear side of the cell.

When used as an electron-emitting material, amorphous diamond materials offer the potential for increasing performance due to the low work function such materials provide. Further, amorphous diamond materials can provide a wide range of band gaps that can allow for "step" excitation of electrons. In particular, electrons may be excited by incident energy, stepping up to higher discrete energy levels much like stepping up a ladder, eventually reaching enough energy that they can be emitted as free electrons. While much success has been obtained using amorphous diamond materials in various generating devices, drawbacks in performance, manufacturability, cost, and other factors have remained.

SUMMARY OF THE INVENTION

Accordingly, the present invention provides materials, devices, and methods for generation of electricity from solar power. In one aspect, the present invention includes a method of reducing back conversion of excited electrons into heat in an amorphous diamond layer. It is presently believed that a significant source of efficiency loss in solar cells using an amorphous diamond layer as an electron emitter is back conversion of excited electrons into heat. In particular, while the many closely-spaced energy bands can facilitate the stepping up of electron energy as heat or incident radiation is received by the amorphous diamond layer, these closely-spaced energy bands can also facilitate the back conversion of electron energy into heat (e.g., phonons or lattice vibrations). Accordingly, improved efficiency can be obtained by using a thin (e.g., 250 nanometer or less) energy receiving portion within the amorphous diamond layer and positioning a conductive material in electrical communication with the energy receiving portion of the amorphous diamond layer. Energy received by the amorphous diamond excites free electrons, which are efficiently moved into the conductive material, since only a short distance needs to be traveled. For example, conversion efficiency in excess of about 20% is believed to be possible using embodiments of the present invention.

In another detailed aspect, a PN type junction can be formed by placing a doped thin-film silicon layer in contact with a doped amorphous diamond layer. The doped amorphous diamond layer may have a thickness of less than about 250 nanometers. A first conductor is in electrical communication with the doped amorphous diamond layer. This places the first conductor within close contact to the doped amorphous diamond layer, so that an increased number of free electrons can be collected by the first conductor before back conversion of the free electron energy into heat.

Other embodiments of the present invention include methods of making a solar cell which includes a thin amorphous diamond layer of less than about 250 nanometers.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 5(a)-FIG. 5(d) show a series of illustrations of a solar cell being fabricated in accordance with another embodiment of the present invention.

Figure 1:
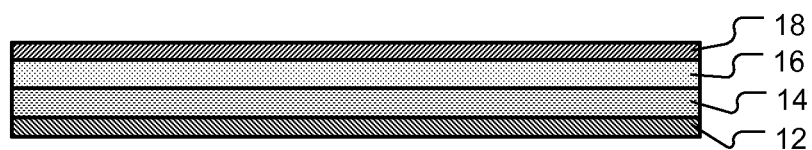
FIG. 1 shows a side view illustration of a solar cell according to one embodiment of the present invention.

The drawings will be described further in connection with the following detailed description. Further, these drawings are not necessarily to scale and are by way of illustration only such that dimensions and geometries can vary from those illustrated.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an," and "the" include plural referents unless the context clearly dictates otherwise. Thus, for example, reference to "a layer" includes one or more of such layers, and reference to "a dopant" includes reference to one or more of such dopants.

DEFINITIONS

In describing and claiming the present invention, the following terminology will be used in accordance with the definitions set forth below.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e., diamond) and carbon bonded in $sp^2$ configuration (i.e., graphite). One example of material having carbon atoms bonded in distorted tetrahedral bonding is amorphous diamond.

As used herein, "diamond-like carbon" refers to a carbonaceous material having carbon atoms as the majority element, with a substantial amount of such carbon atoms bonded in distorted tetrahedral coordination. Diamond-like carbon can be formed, for example by a vapor deposition process. A variety of other elements can be included in the diamond-like carbon material as either impurities, or as dopants, including without limitation, hydrogen, nitrogen, silicon, metals, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "work function" refers to the amount of energy, typically expressed in eV, required to cause electrons in the highest energy state of a material to emit from the material info a vacuum space. Thus, a material such as copper having a work function of about 4.5 eV would require 4.5 eV of energy in order for electrons to be released from the surface into a theoretical perfect vacuum at 0 eV.

As used herein, "electron affinity" refers to the tendency of an atom to attract or bind a free electron into one of its orbitals. Further, "negative electron affinity" (NEA) refers to the tendency of an atom to either repulse free electrons, or to allow the release of electrons from its orbitals using a small energy input. NEA is generally the energy difference between a vacuum and the lowest energy state within the conduction band. It will be recognized that negative electron affinity may be imparted by the compositional nature of the material, or the crystal irregularities, e.g. defects, inclusions, grain boundaries, twin planes, or a combination thereof.

As used herein, "nanotube" refers to a cylindrical molecular structure having a length to width ratio in excess of about 1,000. In particular, carbon nanotubes are formed of rolled hexagonal graphite molecules attached at the edges. Carbon nanotubes may have dimensions of about 1 nanometer to about 10 nanometer in cross section and lengths of about 1 micrometer to about 1 millimeter. Carbon nanotubes may have single wall, double wall, or other configurations.

As used herein, "in electrical communication" refers to a relationship between materials that allows electrical current to flow at least partially between them. This definition is intended to include aspects where the structures are in physical contact and those aspects where the structures are not in physical contact. Two materials which are in electrical communication may form an Ohmic contact (providing a substantially linear current versus voltage characteristic symmetric about zero) or a Schottky contact (where an electrical potential exists between the two materials and a non-linear current versus voltage characteristic results). For example, two plates physically connected together by a resistor are in electrical communication, and thus allow electrical current to flow between them. Conversely, two plates separated by a dielectric material are not in physical contact, but, when connected to an alternating current source, allow electrical current to flow between them by capacitive means. Moreover, depending on the insulative nature of the dielectric material, electrons may be allowed to bore through, or jump across the dielectric material when enough energy is applied.

As used herein, "conversion efficiency" refers to a ratio of output power delivered to an electrical load by the solar cell or other structure compared to the input power or incident radiation. Conversion efficiency is typically measured according to standard test conditions corresponding to a given solar irradiance according to the "air mass 1.5 spectrum" as is known in the art.

As used herein, "metal" refers to a metal, or an alloy of two or more metals. A wide variety of metallic materials are known, such as aluminum, copper, chromium, silver, gold, iron, steel, stainless steel, titanium, tungsten, zinc, zirconium, molybdenum, etc., including alloys and compounds thereof.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 micrometers to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1-3, from 2-4, and from 3-5, etc.

This same principle applies to ranges reciting only one numerical value. Furthermore, such an interpretation should apply regardless of the breadth of the range or the characteristics being described.

THE INVENTION

The present invention involves the use of a thin (e.g., less than about 250 nanometer in thickness) amorphous diamond layer within a solar cell. As recited above, one limitation in the efficiency of solar cells is back conversion of energy from excited charge carriers (e.g., electrons) into heat before the charge carrier can reach an anode or cathode conductor where useful electrical energy can be extracted. Use of a thin amorphous diamond layer may increase the ability of excited electrons to reach a conductor before losing energy. In particular, an amorphous diamond layer can include a relatively thin energy receiving portion, for example having a thickness of about 250 nanometers or less, or as a more particular example, having a thickness of about 100 nanometers or less. A conductive material is positioned in electrical communication with the energy receiving portion of the amorphous diamond layer. The use of a thin amorphous diamond layer allows for free electrons generated in the amorphous diamond layer to quickly reach the conductive material, enhancing the conversion efficiency of the solar cell.

For example, FIG. 1 shows a side view of one embodiment of a solar cell in accordance with an embodiment of the present invention. Specifically, the solar cell, shown generally at 10, includes a first conductor 12. A doped thin-film silicon layer 14 is in electrical communication with the first conductor. The thin-film silicon layer may be, for example, amorphous or microcrystalline. A doped amorphous diamond layer 16 is in contact with the doped thin-film silicon layer. The amorphous diamond layer has a thickness of less than about 250 nanometers, or as a more particular example, a thickness of less than about 100 nanometers. A second conductor 18 is in electrical communication with the doped amorphous diamond layer. The thin-film silicon layer and the amorphous diamond layer form a PN junction.

For example, thin-film silicon may be doped with boron to provide a P-type material and amorphous diamond may be doped with nitrogen to provide an N-type material. As another example, the thin-film silicon may be doped with phosphorous to provide an N-type material, and the amorphous diamond may be doped with boron to provide a P-type material. Of course, many other dopants and combinations of dopants may be used to produce P-type and N-type materials as will occur to one of ordinary skill in the art.

The contact between the doped amorphous diamond layer 16 and the doped thin-film silicon layer 14 creates a PN depletion region in which a bias field exists. Incident radiation can create charge carriers within the depletion region, which are swept to the first and second conductor by the bias field present in the depletion region. By keeping the thickness of the amorphous diamond layer relatively small, the distance that free electrons must travel within the amorphous diamond is kept small relative to the carrier diffusion length so that back conversion into heat is reduced. Accordingly, use of a thin amorphous diamond layer helps to increase the percentage of free electrons which can reach the second conductor before stepping down in energy level. For example, it is believed that conversion efficiencies of greater than at least about 20%, and more particularly, greater than about 30% can be obtained using embodiments of the present invention.

Various materials can be used in constructing the solar cell. For example, the first conductor, second conductor, or both, may be formed of a transparent conductor, including for example, indium tin oxide.

If desired, the first conductor, second conductor, or both can be a doped amorphous diamond layer. Amorphous diamond can be doped to increase electrical conductivity while retaining transparency. For example, doping type and concentration, hydrogen content, $sp^3$ and $sp^3$ bonded carbon content, and combinations thereof can be varied to provide a desired electrical conductivity and light transmissivity. For example, in one aspect, the conductive diamond-like carbon can provide an electrical resistance between about $10^{-2}$ and about $10^{-5}$ ohm-cm. In another aspect, the conductive diamond-like carbon can provide visible light transmissivity of about 30% to about 90%.

Dopants can include, but are not limited to, metals. As a particular example, the doping can include lithium or a combination of lithium and nitrogen. Various sizes and concentration of metal can be used as a dopant. For example, the doping concentration may be between 1 atom % and 70 atom % of metal, although other ranges such as from about 5 to about 60, from about 10 to about 50, from about 25 to about 40, from about 10 to about 30, from about 1 to about 15, and from about 30 to about 40 atom % may be used according to various aspects of the present invention. Metal may be particulate, having any suitable size, for example, about 1 nanometer to about 1 micrometer, although other ranges such as from about 1 nanometer to about 250 nanometer, from about 5 nanometer to about 50 nanometers, and from about 1 nanometer to about 75 nanometer may be used according to various aspects of the present invention. As a particular example, the doping can include gold particulates.

The solar cell 10 can be constructed on a substrate, as described in further detail below. For example, substrates may include glass, semiconductor, ceramic, and polymer materials. Glass can provide an economical substrate. Polymer materials can also be economical and provide the advantage of a flexible substrate allowing the solar cell to be mounted on a curved surface (e.g., a car rooftop).

Figure 2:
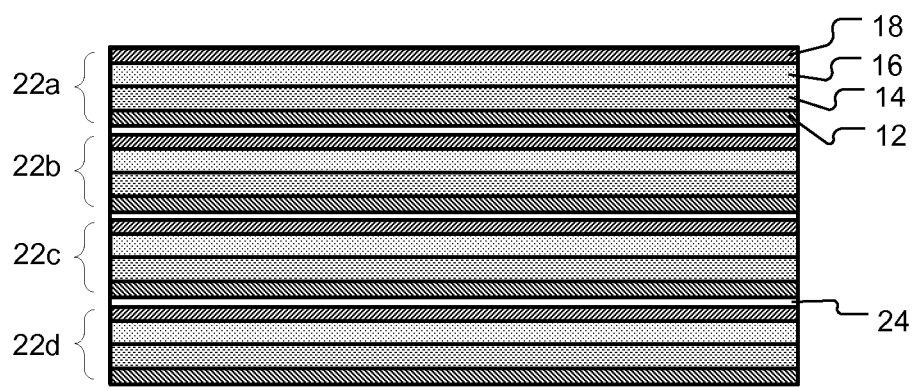
FIG. 2 shows a side view illustration of a solar cell according to another embodiment of the present invention.

It will be appreciated that light or other incident radiation will tend to penetrate the relatively thin layers of the solar cell, and only a portion of the incident radiation will be converted into charge carriers. Accordingly, a plurality of PN junctions may be stacked up to increase the overall efficiency of a solar cell. For example, as shown in side view in FIG. 2, a solar cell 20 can include a plurality of PN junctions 22a, 22b, etc., each PN junction having a first conductor 12, a doped thin-film silicon layer 14, a doped amorphous diamond layer 16, and a second conductor 18. The individual PN junctions may be separated by insulating material 24. Electrical interconnections (not shown) can be provided between the PN junctions to provide for connection in parallel, series, or combinations thereof, to provide desired current/voltage output characteristics.

While the materials used in each PN junction can be substantially similar, this results in similar band gaps for each PN junction. Even higher efficiency may be obtained if the band gaps are varied for some of the PN junctions. For example, the doping of the thin-film silicon, amorphous diamond, or both, can be varied to control the band gap. Wider band gaps can be created in layers closer to the side on which the radiation enters and narrower band gap materials placed deeper within the solar cell. This can further help to improve the efficiency of the solar cell, as the varying band gaps cover a wider range of radiation spectrum. The amorphous diamond itself provides a range of varying band gaps within each layer that helps to capture a broad range of spectral energy.

An alternate approach to increasing the absorption of light or other radiation is to include a light absorbing layer in contact with the amorphous diamond. For example, the light absorbing layer may include a dye material disposed between the amorphous diamond layer and the second conductor and in electrical communication with the amorphous diamond layer. Dye materials may include, as an example, ruthenium chelates. The dye material can help to reduce the amount of light that is reflected or scattered, helping to increase the efficiency of the solar cell.

Figure 3:
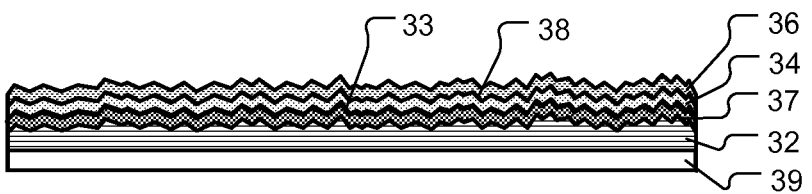
FIG. 3 shows a side view illustration of a solar cell according to yet another embodiment of the present invention.
Figure 4A:
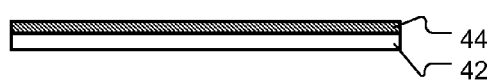
FIG. 4(a)-FIG. 4(d) show a series of illustrations of a solar cell being fabricated in accordance with an embodiment of the present invention.
Figure 4B:
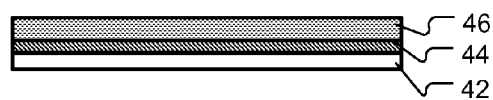
Figure 4C:
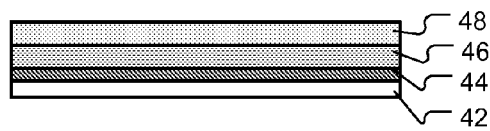
Figure 4D:
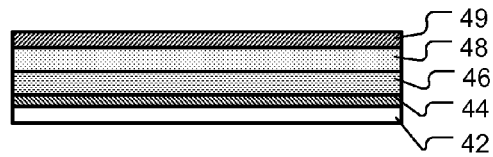

As another example, carbon nanotubes can be used for one of conductors. The carbon nanotubes can provide high conductivity while remaining substantially transparent to incident radiation, particularly in the longer wavelength infrared regions. For example, FIG. 3 illustrates an exaggerated side view of a solar cell in accordance with another embodiment of the present invention. The solar cell 30 can include a first conductor that comprises a carbon nanotube layer 32. The carbon nanotubes can present a non-planar surface 33 to which an N-type doped amorphous diamond layer 34 and a P-type doped thin-film silicon layer 36 conform. This forms a non-planar junction 38 between the P-type and N-type materials. This helps to increase the amount of junction area present within a given amount of substrate area, while keeping the distance from the junction to the conductors relatively short. A similar device can be constructed by using N-type doping of the thin-film silicon layer and P-type doping of the amorphous diamond layer.

If desired, a light absorbing layer 37 may be disposed between the carbon nanotube layer 32 and then-type doped amorphous diamond layer 34 to help improve radiation absorption of the solar cell 30. The roughness of the non-planar surface 33 can help to hold the layer of light absorbing material (e.g. a dye) in place. The roughness also increases the area of the light absorbing layer that is able to collect radiation, helping to increase efficiency of the solar cell.

The carbon nanotubes may be arranged in a mat, in which the carbon nanotubes are randomly disposed. Alternately, the carbon nanotubes may be oriented preferentially, with ends of the carbon nanotubes disposed in a direction substantially perpendicular to a junction.

If desired the carbon nanotubes may be disposed on a conductive substrate 39 (e.g., metal) or an insulating substrate (e.g., glass) that has been coated with a conductor (e.g., indium tin oxide).

Figure 6:
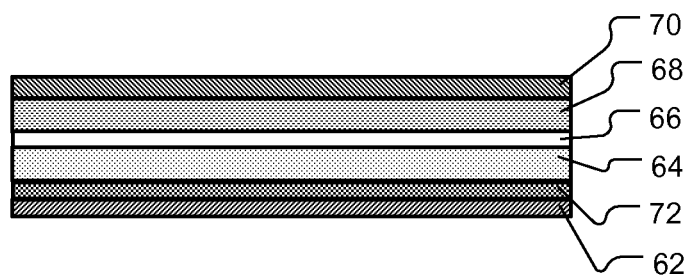
FIG. 6 shows a cross-sectional view illustration of a solar cell according to another embodiment of the present invention.

Operation of the solar cell may be enhanced by including a thin dielectric material within the PN junction, interposed between P-type and N-type materials. For example, FIG. 6 illustrates a cross-sectional view of a solar cell in accordance with another embodiment of the present invention. The solar cell includes a first conductor 62, a P-type doped amorphous diamond layer 64, an interface layer 66, an N-type doped thin-film silicon layer 68, and a second conductor 70. The interface layer can be formed of a dielectric material, including for example, barium titanate ($BaTiO_3$) or lead zirconate titanate ($PbZr_xTi_{1-x}O_3$, $0<x<1$; aka PZT). The interface layer may be quite thin, for example about 50 nm or less. The interface layer may also be doped to control resistance, for example, by including dopants, particulates, carbon nanotubes, etc. As described above, a light absorbing layer 72 may also be included if desired.

Additional enhancement in the operation of the solar cell may be provided by including conductive particulates 74 or carbon nanotubes within the active layers (i.e., within the doped amorphous diamond layer 64, within the doped thin-film silicon layer 66, or within both) to help reduce the contact resistance between the active layers and the conductors 62, 70.

Various ways of fabricating solar cells in accordance with embodiments of the present invention are possible. For example, FIG. 4(*a*) through FIG. 4(*d*) illustrate a solar cell 42 in various stages of fabrication. Fabrication can be performed on a substrate 44 as shown in FIG. 4(*a*). The substrate can be conductive, in which case it functions as a first conductor. Alternately, if desired, the first conductor can be formed on the substrate 46. The first conductor can be formed by printing, deposition, or otherwise applying a conductive material to the substrate. For example, deposition can performed using a process that grows, coats, or otherwise transfers a material onto the wafer. For example, depositing materials can be performed by spin coating, physical vapor deposition (PVD), chemical vapor deposition (CVD), electrochemical deposition (ECD), molecular beam epitaxy (MBE), atomic layer deposition (ALD), and similar processes. A wide variety of variations of vapor deposition methods can be used. Examples of vapor deposition methods include hot filament CVD, radio frequency (RF) CVD, laser CVD (LCVD), metal-organic CVD (MOCVD), sputtering, thermal evaporation PVD, ionized metal PVD (IMPVD), electron beam PVD (EBPVD), reactive PVD, atomic layer deposition (ALD) and the like.

As shown in FIG. 4(*b*), a thin-film silicon layer 46 can be formed on the substrate 42 (or on the first conductor 44, if present). For example, the thin-film silicon layer can be formed by deposition as described above. The thin-film silicon layer can be doped. Doping can be performed while the thin-film silicon layer is formed by co-deposition of dopants, for example by co-evaporation of desired dopants while depositing the silicon layer. As another example, doping can be performed after the thin-film silicon layer is formed by ion implantation, drive-in diffusion, field-effect doping, electrochemical doping, vapor deposition, or the like. Various dopants can be used to form a P-type material, including for example, boron or an N-type material, including for example, phosphorous, and other dopants as known to those of ordinary skill in the art.

As shown in FIG. 4(*c*), an amorphous diamond layer 48 can be deposited on the doped thin-film silicon layer 46. The amorphous diamond layer has a thickness of about 250 nanometers or less, or as a more particular example, a thickness of about 100 nanometers or less. The amorphous diamond layer can be deposited using various techniques, including for example vapor deposition and other processes.

As a particular example, the amorphous diamond layer 48 may be deposited using a cathodic arc method. Cathodic arc methods generally involve the physical vapor deposition of carbon atoms onto a target. An arc is generated by passing a large current through a graphite electrode which vaporizes. A negative bias of varying intensity is used to drive the carbon atoms toward the target. If the carbon atoms contain a sufficient amount of energy (e.g., about 100 eV) they impinge on the target and adhere to its surface to form a carbonaceous material, such as amorphous diamond.

In general, the kinetic energy of the impinging carbon atoms can be adjusted by varying the negative bias applied to the target and the deposition rate can be controlled by the current through the arc. Control of these parameters, as well as others, can also affect the degree of distortion of the carbon atom tetrahedral coordination and the geometry or configuration or the amorphous diamond material. For example, increasing the negative bias can increase $sp^3$ bonding. By measuring the Raman spectra of the material the $sp^3/sp^2$ ratio can be determined, although it will be appreciated that the distorted tetrahedral portions of an amorphous diamond layer may be neither $sp^3$ nor $sp^2$ but a range of bonds which are of intermediate character. Further, increasing the arc current can increase the rate of target bombardment with high flux carbon ions. As a result, temperature can rise so that deposited carbon will convert to more stable graphite. Thus, final configuration and composition (i.e., band gaps, negative electron affinity, and emission surface geometry) of the amorphous diamond material can be controlled by manipulating the cathodic arc conditions under which the material is formed.

The amorphous diamond layer 48 can be doped, for example, by co-deposition of dopants or by ion implantation after deposition, for example, as described above. Various dopants can be used to form an N-type material, including for example, nitrogen, lithium, or combinations thereof, or the form a P-type material, including for example, boron.

If desired, a light absorbing layer may be formed, either before or after forming the amorphous diamond layer, so that the light absorbing layer is in contact with the amorphous diamond layer. If desired, an interface layer of dielectric material can be deposited on the thin-film silicon layer before deposition of the amorphous diamond layer.

A second conductor 49 can be formed on the doped amorphous diamond layer. The second conductor can be formed by printing, deposition, or otherwise applying a conductive material to the substrate using techniques as described above for deposition of the first conductor. Various conductive materials can be used, including for example a transparent conductor such as indium tin oxide. As another example, the second conductor can be formed by doping an upper portion of the amorphous diamond layer 48 to provide high conductivity. For example, as discussed above, the diamond-like carbon material may be doped sufficiently to lower the electrical resistance to less than $10^{-2}$ ohm-cm. As yet another example, forming the second conductor can include depositing or growing carbon nanotubes. For example, carbon nanotubes may be formed using various techniques known in the art, and deposited to onto the solar cell to form the second conductor. As another example, carbon nanotubes may be grown in situ using various techniques known in the art.

An alternate approach for fabricating a solar cell is illustrated in FIG. 5(a) through FIG. 5(d). The solar cell 50 can be fabricated on a provided substrate 52 as shown in FIG. 5(a). Various substrates, as described above, can be used. A first conductor 53, including for example, a layer of carbon nanotubes 54, can be formed on the substrate, for example, using techniques as described above. A layer of amorphous diamond 56 is deposited over the first conductor as shown in FIG. 5(b). The amorphous diamond layer can have a thickness of less than about 250 nanometers. The amorphous diamond layer can be doped, for example, using techniques as described above. A light absorbing layer may be fabricated so that it is in contact with the amorphous diamond layer if desired. An interface layer of dielectric material can be deposited on the amorphous diamond if desired.

A thin-film silicon layer 58 is deposited on the amorphous diamond layer 56 as shown in FIG. 5(c), for example, using techniques as described above. The thin-film silicon layer can be doped, for example, using techniques as described above. A second conductor 59 can be formed on top of the thin-film silicon layer as shown in FIG. 5(d).

First and second conductors can be deposited as continuous layers (e.g., when using a transparent conductor) or can be patterned to minimize blockage of radiation (e.g., when using silver, gold, or other less transparent conductors). Patterning can be performed using lithography. In lithography, a resist layer is applied to the device being fabricated and is then exposed through a mask to define the various features. Either the exposed (positive photoresist) or unexposed (negative photoresist) regions are washed away by a developer solution to expose portions of the device. Etching or other processing can be used to remove material from the exposed regions. Etching can be performed, for example, by wet etching or dry etching, such as reactive ion etch (RIE).

Alternately, lithography can be performed using a lift off process, where materials are deposited over the developed mask, and then the mask is removed, causing material in masked portions to be removed along with the mask. Liftoff can be advantageous when deposited materials are difficult to etch or otherwise remove. Multiple layers of materials may be deposited and lifted off in a single step.

Summarizing and reiterating to some extent, it will be appreciated that solar cells in accordance with embodiments of the present invention may provide significant advantages over previous devices. Use of amorphous diamond with its particular band structure can help to provide higher conversion efficiency than conventional silicon-based solar cells. Reduction of back conversion of excited electrons into heat using the presently disclosed techniques can further increase the efficiency of a solar cell. Fabrication of the solar cell is possible using amorphous materials, avoiding the need for single crystal semiconductor substrates and helping to make the solar cell more economical.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A solar cell comprising:
   a first conductor;
   a doped thin-film silicon layer in electrical communication with the first conductor, wherein the silicon layer is amorphous silicon;
   a doped amorphous diamond layer in contact with the doped thin-film silicon layer, wherein the doped amorphous diamond layer has a thickness of less than about 250 nanometers, and wherein the doped thin-film silicon layer is a p-type material and the doped amorphous diamond layer is an n-type material, and wherein the doped thin-film silicon layer and the doped amorphous diamond layer form a p-n junction; and a second conductor in electrical communication with the doped amorphous diamond layer.

2. The solar cell of claim 1, further comprising a substrate disposed under the first conductor.

3. The solar cell of claim 2, wherein the substrate is a polymer material.

4. The solar cell of claim 3, wherein the substrate is pliable to enable the solar cell to be affixed to a curved surface.

5. The solar cell of claim 1, wherein the second conductor comprises a doped portion of the amorphous diamond layer.

6. The solar cell of claim 1, wherein the second conductor comprises a carbon nanotube layer.

7. The solar cell of claim 6, wherein the carbon nanotube layer comprises a non-planar surface.

8. The solar cell of claim 7, wherein amorphous diamond layer and the thin-film silicon layer conform to the non-planar surface of the carbon nanotube layer to form a non-planar junction.

9. The solar cell of claim 1, further comprising a substrate disposed under the second conductor.

10. The solar cell of claim 1, wherein the second conductor comprises doped amorphous diamond.

11. The solar cell of claim 1, wherein the second conductor is transparent.

12. The solar cell of claim 11, further comprising a light absorbing layer disposed between the second conductor and the amorphous diamond layer.

13. The solar cell of claim 1, further comprising a plurality of junctions, each junction comprising a first conductor, a doped thin-film silicon layer in contact with the first conductor, and a doped amorphous diamond layer in contact with the doped thin-film silicon layer, wherein the amorphous diamond layer has a thickness of less than about 250 nanometer.

14. The solar cell of claim 13, wherein at least two of the plurality of junctions have a substantially equal band gap.

15. The solar cell of claim 13, wherein at least two of the plurality of junctions have a substantially different band gap.

16. The solar cell of claim 1, further comprising a dielectric layer interposed between the doped thin-film silicon layer and the doped amorphous diamond layer.

17. A solar cell comprising:
a first conductor;
a doped thin-film silicon layer in electrical communication with the first conductor, wherein the silicon layer is amorphous silicon;
a doped amorphous diamond layer in direct physical contact with the doped thin-film silicon layer, wherein the doped amorphous diamond layer has a thickness of less than about 250 nanometers, and wherein the doped thin-film silicon layer is a p-type material and the doped amorphous diamond layer is an n-type material; and
a second conductor in electrical communication with the doped amorphous diamond layer.

* * * * *